United States Patent [19]

Plies

[11] Patent Number: 4,728,790
[45] Date of Patent: Mar. 1, 1988

[54] LOW-ABBERATION SPECTROMETER OBJECTIVE WITH HIGH SECONDARY ELECTRON ACCEPTANCE

[75] Inventor: Erich Plies, Munich, Fed. Rep. of Germany

[73] Assignee: Siemens Aktiengesellschaft, Berlin and Munich, Fed. Rep. of Germany

[21] Appl. No.: 41,654

[22] Filed: Apr. 21, 1987

Related U.S. Application Data

[63] Continuation of Ser. No. 858,919, May 2, 1986.

[30] Foreign Application Priority Data

Jun. 14, 1985 [DE] Fed. Rep. of Germany ....... 3521439

[51] Int. Cl.⁴ ..................... H01J 37/252; H01J 49/44
[52] U.S. Cl. ..................................... 250/305; 250/310
[58] Field of Search ............................... 250/310, 305; 324/158 D

[56] References Cited

U.S. PATENT DOCUMENTS 4,464,571 8/1984 Plies ..................................... 250/305

FOREIGN PATENT DOCUMENTS 0197644 11/1983 Japan .................................. 250/310

OTHER PUBLICATIONS

Japanese Publication Proceeding of the Symposium on Electron Beam Testing 9, Nov. 10, 1984, Osaka, Japan pp. 69-72, Entitled Electron Beam Tester Within the Lens Analyzer by Kamamato.

Primary Examiner—Craig E. Church
Assistant Examiner—Jack I. Berman
Attorney, Agent, or Firm—Hill, Van Santen, Steadman & Simpson

[57] ABSTRACT

The spectrometer objective of the invention is composed of a short focal length objective lens (OL) and a spectrometer-detector arrangement which is completely integrated in the magnetic lens. The working distance (L) has a decisive influence on the chromatic and spherical image defect of the objective lens (OL) which can be reduced with the arrangement of the invention and, thus, the diameter of the electron probe on the specimen (PR) can be substantially demagnified. An angle-independent accumulation of the secondary electrons (SE) are triggered such that the measuring location occurs according to the invention by imaging of the virtual source point (QS) of the secondary electrons (SE) into the center of a spherical opposing field which occurs in the spatial region between two spherical-symmetrical grid electrodes (K1 and K2).

12 Claims, 4 Drawing Figures

LOW-ABBERATION SPECTROMETER OBJECTIVE WITH HIGH SECONDARY ELECTRON ACCEPTANCE

This is a continuation of application Ser. No. 858,919, filed May 2, 1986.

BACKGROUND OF THE INVENTION

1. Field of the Invention

This invention relates in general to a low abberation spectrometer objective having high electron acceptance.

2. Description of the Prior Art

Conventional scanning electron microscopes have beam blanking systems and are equipped with opposing field spectrometers and are currently utilized for quantitative measurements of potentials at nodes and interconnects in VLSI circuits. However, adequately fine electron probes for the examination of VLSI circuits having structures in the submicron range cannot be produced with modified scanning electron microscopes since these apparatuses must be operated at low primary electron energies so as to avoid radiation damage and charging of the components which are usually arranged in insulating carrier materials. A noticeable improvement in the spatial resolution which is essentially limited by the axial chromatic abberation of the objective lens and by the electronelectron interaction (Boersch effect) can be achieved only by means of a short electron optical beam path having few cross-overs and an objective lens having a short focal length. Up to the present, the use of short focal objective lens having a short working distance for the reduction of the chromatic and spherical image defects essentially defined by the focal length and working distance has been unsuccessful due to the structure of the conventional electron beam measuring instruments wherein a secondary electron spectrometer is arranged between the objective lens and the specimen.

Only as a result of the development of objective lens with integrated secondary electron spectrometer objective has the abberation of the objective lens been reduced with the working distance and, thus, the probe diameter on the specimen can now be demagnified. Such a spectrometer lens is described in publication by Kawamoto entitled "Electron Beam Tester With In the Lens Analyzer" published in the Proceedings of the Symposium on Electron-Beam-Testing dated Nov. 9-10 1984, Osaka, Japan Pages 69-72.

This known arrangement has a short focal length magnetic objective lens comprising an integrated parallel plate analyzer and an electrode arranged above the objective lens for deflecting the secondary electrons in the direction of a detector.

In this known spectrometer objective lens comprising a planar extraction and opposing field electrode however, no angle independent documentation of the secondary electrons triggered on the specimen and emitted into a larger solid angle ranges is possible and, thus, the obtainable resolution of potential is limited as the consequence of measuring errors which are thus caused.

U.S. Pat. No. 4,464,571 which issued on Aug. 7, 1984 entitled "Opposing Field Spectrometer For Electron Beam Mensuration Technology" in which the inventor is Erich Plies and which is assigned to the assignee of the present application discloses an improved electrostatic opposing field spectrometer that can be utilized for taking measurements with an electron beam probe which has an extraction electrode and an opposing field electrode and two spherical networks for generating a spherically symmetrical opposing field.

SUMMARY OF THE INVENTION

It is an object of the present invention to provide a low abberation spectrometer objective of the type initially listed above which has a high secondary electron acceptance and with which the secondary electrons can be documented in an angle independent manner at the measuring location independently of their emission direction.

It is a feature of the present invention that a spectrometer objective for quantitative measurements of potential in electron beam mensuration technology where an objective lens for focusing a primary electron beam onto a specimen and an electrostatic opposing field spectrometer comprises an electrode arrangement for the extraction of secondary electrons triggered at the measuring location by the primary electron beam, comprises an electron arrangement (K1, K2) for generating an electrical opposing field which retards the secondary electrons (SE) form an electron optical unit to which a detector arrangement is associated for recording the secondary electrons and wherein the opposing field electrode arrangement comprises two spherical symmetrical electrodes (K1, K2) which have potentials ($V_D$, $V_E$) which are selected such that a spherical symmetrical opposing field occurs in the space between the electrodes. Furthermore, the center of the spherical symmetrical electrodes K1 and K2 coincide at a point ZS which lies on the optical axis OA of the spectrometer objective above the pole shoe and this point ZS which defines the center of the spherical symmetrical opposing field lies in a field free space within the objective lens OL and the secondary electrons SE accelerated in the electrical field of the extraction electrode arrangement G1 are focused in the magnetic field of the objective lens OL and are focused into the center of the spherical symmetrical opposing field ZS.

An advantage obtainable with the invention is that the diameter of the electron probe generated in the electron optical column of an electron measuring instrument is reduced on the specimen and the resolution of potential can be noticeably enhanced by the angle independent recording of the secondary electrons.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

DESCRIPTION OF THE PREFERRED EMBODIMENTS

Figure 1:
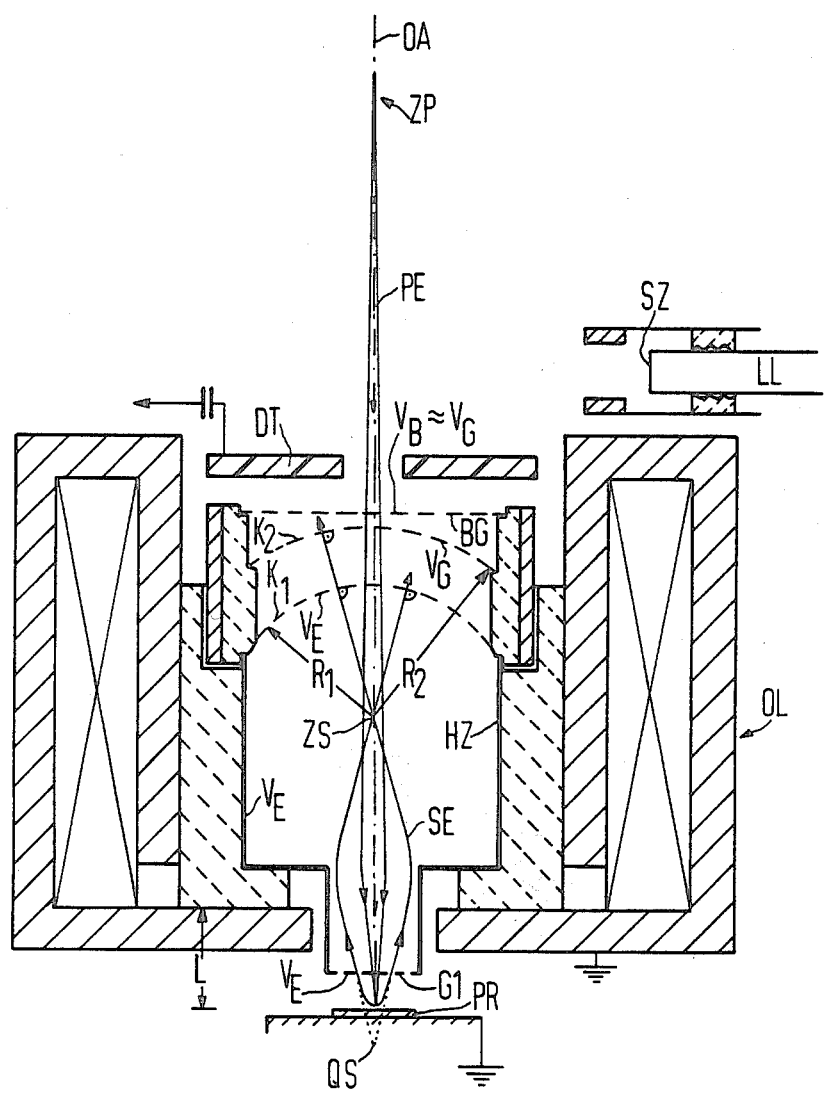
FIG. 1 is a first exemplary embodiment of a spectrometer objective according to the invention.

FIG. 1 illustrates an exemplary embodiment of a spectrometer objective according to the invention which is formed of a short focal length magnetic objective lens OL and a spectrometer-detector arrangement mounted within the magnetic lens. The overall system forms an electron-optical unit with which both the primary electrons PE which are generated in an electron source as well as the secondary electrons SE generated on a specimen PR are focused at a point lying on the optical axis OA. So as to generate a fine electron probe, the intermediate image ZP of the electron source generated by condenser lenses is imaged and demagnified onto the specimen PR which is arranged in the focal plane of the objective lens OL. The image is formed with the assistance of the spectrometer objective as part of the beam shaping system. A working distance L which is extremely short as compared to conventional devices can be achieved with the spectrometer objective of the present invention and the working distance L has an important influence on the chromatic and spherical image defects of the objective lens OL and thus on the diameter of the probe on the specimen PR. So as to document the low energy secondary electrons SE which occur at the measuring point due to the high energy primary electrons PE as a result of the interaction of the primary electrons with the solid state substance being investigated, the low energy secondary electrons are emitted into the full solid angle region above the specimen PR and are then extracted in the electrical field of a planar grid electrode G1 which projects out between the pole shoes of the objective lens OL and the secondary electrons are accelerated in the direction of the optical axis OA to relative high energies of typically 1 to 2 keV.

The secondary electrons SE pass through the grid electrode G1 and reach the magnetic field between the pole shoes which focusses them at a point ZS which lies on the optical axis OA within the objective lens. The position of the focussing point ZS which comprises a real intermediate image of the virtual secondary electron source QS lying below the specimen PR is defined by the height of the positive grid electrode voltage $V_E$ and the magnetic field strength between the pole shoes of the objective lens OL which depends on the primary electron energy. The virtual source QS is defined by the smallest cross-sectional surface of all secondary electron trajectories below the specimen PR. The common focussing of all secondary electrons SE in the field of the objective lens OL is only possible due to their acceleration to high kinetic energies ($E_{SE} = 1$ to 2 keV) since only under these conditions the relative energy width $\Delta E/\overline{E}$ ($\overline{E}$ = mean kinetic energy of the secondary electrons) is reduced to a degree such that the image distances of the secondary electrons SE emitted at the measuring point with different kinetic energies still almost coincide.

The angle independent retardation and energy analysis of the secondary electrons SE occurs within the objective lens OL in a spherical symmetrical electrical opposing field which is built up in the spatial region between two spherically symmetrical grid electrodes K1 and K2 which have different potentials. The electrode arrangement may be of the type which is known and which is shown for example, in U.S. Pat. No. 4,464,571, previously referenced. According to the invention, the lower grid electrode K1 is electrically conductively connected to the extraction electrode G1 through a hollow cylinder HZ which is arranged concentrically relative to the optical axis OA and tapers in the pole shoe gap and is connected thereto such that a space inside the objective lens is generated which is free of electrical fields. The upper spherical symmetrical grid electrode K2 is an opposing field grid and typically has a voltage VG between about $-15$ and $+15$ volts. A buffer grid BG has a potential $V_B$ which is about the same as the voltage $V_G$ of the upper spherical electrode K2 can also be provided above the electrode arrangement which forms the opposing field.

An angle independent detecting of the secondary electrons SE can only occur when the secondary electron trajectories proceed parallel to the electrical field lines of the opposing field and thus proceed perpendicular to the surface of the spherical symmetrical grid electrodes K1 and K2. So as to achieve this result, the virtual source point QS of the secondary electrons SE is imaged onto the center of the spherical opposing field ZS in other words, into the center of the spherical grid electrodes K1 and K2 which lies on the optical axis above the pole shoe. It should also be noted that the real intermediate image ZS of the secondary electrons SE lies on the optical axis OA at a distance sufficiently above the pole shoe gap of the objective lens OL in a spatial region wherein the magnetic induction B has disappeared so that a Larmor precision of the secondary electrons SE is avoided after passing through the intermediate image ZS. The focusing of the secondary electrons SE onto a point ZS of the optical axis OA which lies in a spatial region with disappearing $B_Z (0, 0, z)$ is possible with increasingly better results as the energy of the primary electrons PE is lowered and the extraction potential VE of the grid electrode G1 which accelerates the secondary electrons becomes higher.

An annular detector DT is arranged concentrically relative to the optical axis OA and is provided within the spectrometer objective of the invention for detecting and recording the secondary electrons SE. For example, semiconductor detectors, channel plates or metal plates having electron traps are particularly suited for this purpose. In addition to the annular secondary detector DT, a further conventional secondary electron detector can also be provided outside of the spectrometer objective, for example, an arrangement formed of a scintillator SZ and a light pipe LL with these elements being provided for recording the secondary electrons emitted in the direction of the optical axis OA.

Figure 2:
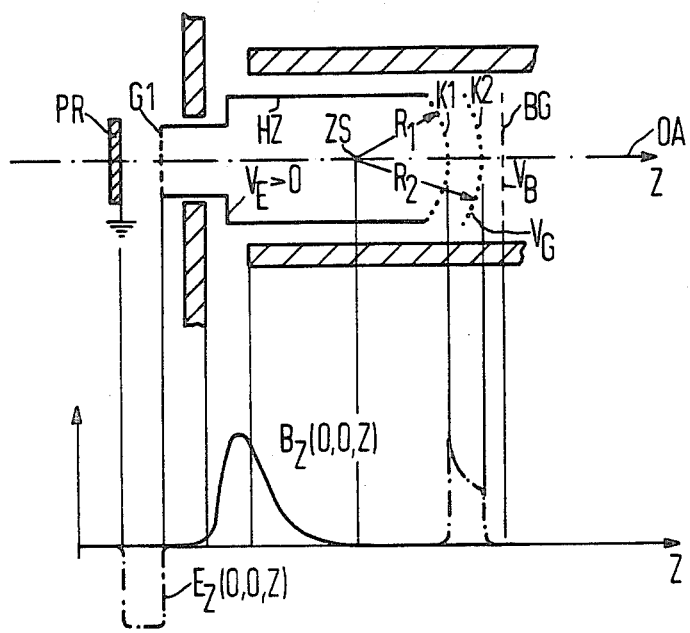
FIG. 2 illustrates the electrical and magnetic field distribution within a spectrometer illustrated in FIG. 1.

FIG. 2 in the lower portion illustrates the graph of the magnetic induction $B_Z (0, 0, z)$ in solid line and the electrical field strength $E_Z (0, 0, z)$ in dot-dash line between the specimen PR and the buffer grid BG in the direction of the optical axis OA for a spectrometer objective according to the invention illustrated in FIG. 1. The center of the spherical opposing field ZS lies on the optical axis in a spatial region in which the magnetic induction $B_Z(0, 0, z)$ disappears. A Larmor precision of the secondary electrons SE after passing through the intermediate image ZS is thereby avoided so that their trajectories pass parallel to the electrical field line of the spherical symmetrical opposing field.

Figure 3:
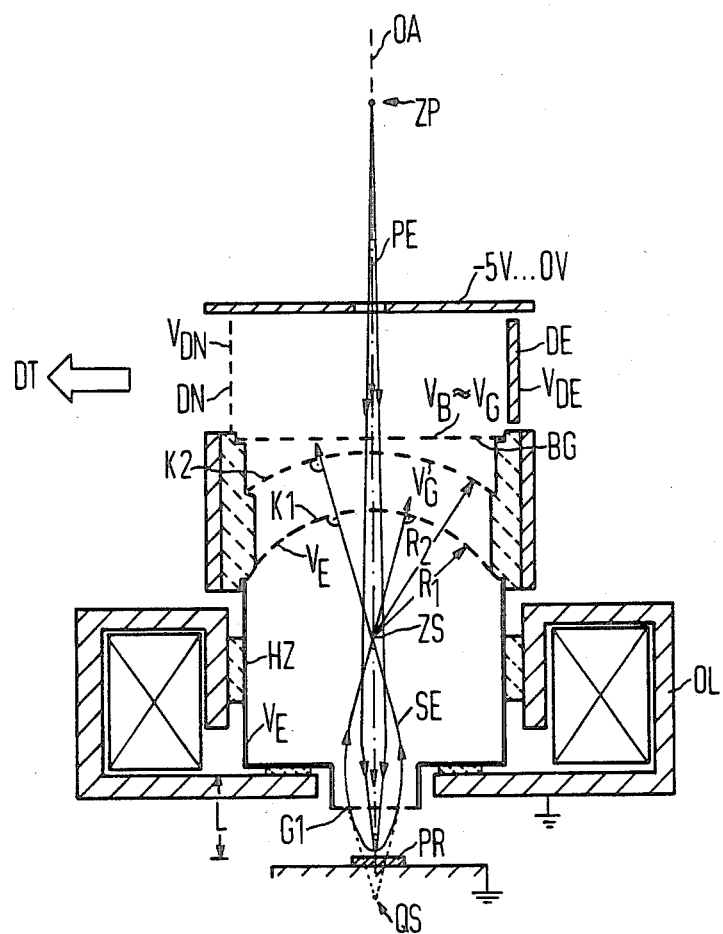
FIG. 3 illustrates a second exemplary embodiment of a spectrometer objective according to the invention.

FIG. 3 illustrates a second embodiment of a spectrometer objective of the invention. In this arrangement, the virtual source point QS of the secondary electrons SE is also imaged into the center of the spherical symmetrical opposing field ZS lying within the spectrometer objective. The center of the spherical opposing field ZS which coincides with the center of the spherical symmetrical electrodes K1 and K2 which are arranged intermediately above the objective lens OL lies within the objective lens OL on the optical axis and also lies in a spatial region in which the magnetic induction B and the electrical field E disappear. The extraction electrode G1 and the lower spherical symmetrical electrode K1 are connected to each other by a hollow cylinder HZ which is concentrically arranged relative to the optical axis OA and tapers in the pole shoe gap so that a space free of electrical fields occurs in the inside of the objective lens OL.

Figure 4:
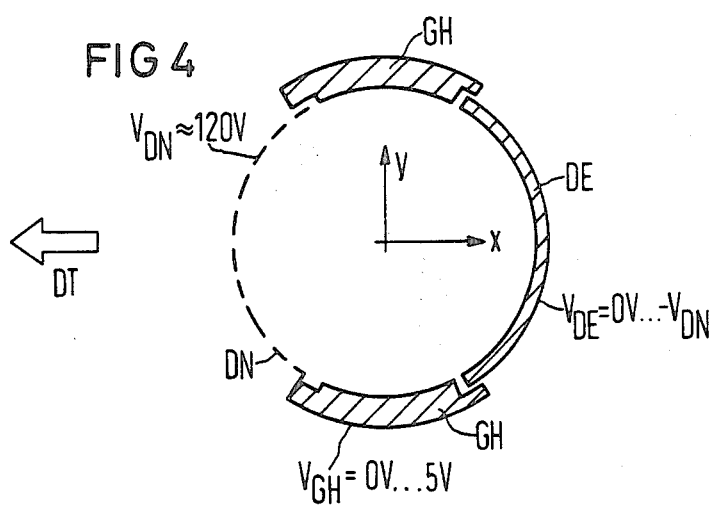
FIG. 4 is a sectional plan view of the spectrometer objective illustrated in FIG. 3.

An electrode arrangement for the deflection and acceleration of the secondary electrons SE in the direction of a detector DT (not illustrated in FIG. 3) is mounted above the electrodes K1 and K2 which generate the spherical symmetrical opposing field. Such deflection element which is illustrated in section in FIG. 4 as perpendicular to the optical axis OA is advantageously formed of a net-shaped electrode DN which has a positive potential of $V_{DN}$ and of a deflector electrode DE which is symmetrically arranged relative thereto and has a negative potential of $V_{DE}$. The elements DN and DE together with the housing members GH which are arranged between the two electrodes form the generated surface of a hollow cylinder which is arranged concentrically relative to the optical axis OA. The voltages $|V_{DE}| = |V_{DN}|$ are between 100 and 150 volts and are selected to be identical to the voltage advantageously applied to the net-shaped electrode DN and to the deflector electrode DE. So as to prevent reach through of the net-shaped electrode potential $V_{DN}$ into the space between the spherical symmetrical electrodes K1 and K2, a buffer grid BG illustrated in FIG. 3 can also be provided between the deflector portion and the electrode K2. The buffer grid BG lies at approximately the same potential as the spherical electrode $K2(V_G=V_B)$.

Although the invention has been described with respect to preferred embodiments, it is not to be so limited as changes and modifications can be made which are within the full intended scope of the invention as defined by the appended claims.

I claim as my invention:

1. A spectrometer for quantitative measurements of potentials in electron beam mensuration technology, comprising an electron beam source, an objective lens (OL) for focusing a primary electron beam (PE) from said source onto a specimen (PR), an electrostatic opposing field spectrometer which comprises an electrode arrangement (G1) for the extraction of secondary electrons (SE) triggered at the measuring location by the primary electron beam (PE), an electrode means (K1, K2) for generating an electrical opposing field which retards the secondary electrons (SE) from the specimen, and a detector for recording the secondary electrons (SE), characterized in that the opposing field electrode means comprises two spherical-symmetrical electrodes (K1, K2) which have potentials ($V_D$, $V_E$) which are selected such that a spherical-symmetrical opposing field builds up in the space between said electrodes; the centers of said spherical-symmetrical electrodes (K1, K2) coincide at a point (ZS) which lies on the optical axis (OA) of the spectrometer objective above a pole shoe thereof; and said point (ZS) defines the center of the spherical-symmetrical opposing field and lies in a field-free space within the objective lens (OL) so that the secondary electrons (SE) are accelerated in the electrical field of the extraction electrode arrangement (G1) and are focused in the magnetic field of the objective lens (OL), such that they are focused into the center of the spherical-symmetrical opposing field (ZS).

2. A spectrometer according to claim 1, characterized in that, for generating a space in the inside of the objective lens which is free of electrical fields, the electrode arrangement (G1) for the extraction of the secondary electrons (SE) and said spherical-symmetrical electrode (K1) which is the closest to the specimen (PR) are electrically connected by a hollow cylinder (HZ) which is concentrically mounted relative to the optical axis (OA) and tapers in the pole shoe gap.

3. A spectrometer according to claims 1 or 2, characterized in that said electrode means (K1, K2) which builds up a spherical-symmetrical opposing field is arranged above the pole shoe in the inside of the objective lens (OL).

4. A spectrometer according to claims 1 or 2, characterized in that an annular secondary electron detector (DT) which is mounted concentrically relative to the optical axis is provided above the electrode means (K1, K2) in the inside of the objective lens (OL) which builds up the spherical-symmetrical opposing field.

5. A spectrometer according to claims 1 or 2 characterized in that a further secondary electron detector is provided above the annular secondary electron detector (DT) which is mounted concentrically relative to the optical axis in the inside of the objective lens (OL).

6. A spectrometer according to claims 1 or 2, characterized in that a buffer grid (BG) is provided between said electrode means (K1, K2) which builds up a spherical-symmetrical opposing field and the annular secondary electron detector (DT).

7. A spectrometer according to claims 1 or 2, characterized in that said electrode means (K1, K2) which builds up a spherical-symmetrical opposing field is arranged immediately above the objective lens (OL).

8. A spectrometer according to claim 7, characterized in that an arrangement (DE, DN) for the deflection and acceleration of the secondary electrons (SE) in the direction of a detector (DT) is provided above said electrode means (K1, K2) which builds up a spherical-symmetrical opposing field.

9. A spectrometer according to claim 8, characterized in that the arrangement (DE, DN) for the deflection and acceleration of the secondary electrons (SE) in the direction of a detector (DT) comprises a grid electrode (DN) lying at positive potential ($V_{DN}$) and a deflection electrode (DE) which is arranged symmetrically thereto and has a negative potential, said grid electrode and said deflection electrode forming, together with the housing (GH) situated between these electrodes (DE, DN), the generated surface of a hollow cylinder which has an axis of symmetry which coincides with the optical axis (OA).

10. A spectrometer according to claim 9, characterized in that a buffer grid (BG) is provided between said electrode means (K1, K2) which builds up a spherical-symmetrical opposing field and the arrangement (DE, DN) for the deflection and acceleration of the secondary electrons (SE) in the direction of a detector (DT).

11. A spectrometer for quantitative electron beam measurements comprising an objective lens for focusing a primary electron beam from an electron beam source onto a specimen, a retarding potential spectrometer which comprises a first electrode arrangement for the acceleration of secondary particles triggered at said specimen in the direction of said objective lens, a second electrode arrangement for the deceleration of said secondary particles, said second electrode arrangement comprises two spherical-symmetrical electrodes which have different potentials; the center points of these electrodes coincide in a point lying on the optical axis of said objective lens above pole shoes thereof, and said point defines the center of the spherical-symmetrical retarding field and lies in a spatial region within the objective lens that is free of electrical fields and such point coincides with the focus point of the accelerated secondary particles.

12. A spectrometer for quantitative electron beam measurements comprising an objective lens for focusing a primary electron beam from an electron beam source onto a specimen, a retarding potential spectrometer which comprises a first electrode arrangement for the acceleration of secondary particles triggered at said specimen in the direction of said objective lens, a second electrode arrangement for the deceleration of said secondary particles, said second electrode arrangement comprises two electrodes that form parts of the surface of two spheres having different radii; and these electrodes have potential such that a spherical-symmetrical retarding field is built up in the spatial region between said electrodes; the center points of said two electrodes coincide in a point lying on the optical axis of the objective lens above pole shoes; and said point defining the center of the spherical-symmetrical retarding field lies within a spatial region within the spectrometer objective lens that is free of electrical fields and said point coincides with the focus point of the secondary particles.

* * * * *